Aug. 14, 1956 G. O. PUERNER ET AL 2,759,158

U.H.F. TUNER

Filed Dec. 16, 1952 2 Sheets-Sheet 1

INVENTORS
George O. Puerner
BY Joseph R. Twinam

Nicholas Lang Jr.
ATTORNEY

U.H.F. TUNER

Filed Dec. 16, 1952 2 Sheets-Sheet 2

INVENTORS
George O. Puerner
Joseph R. Twinam
BY
Nicholas Lang
ATTORNEY

United States Patent Office 2,759,158

Patented Aug. 14, 1956

2,759,158

U. H. F. TUNER

George O. Puerner and Joseph R. Twinam, Indianapolis, Ind., assignors to P. R. Mallory & Co., Inc., Indianapolis, Ind., a corporation of Delaware Application December 16, 1952, Serial No. 326,197

14 Claims. (Cl. 336—87)

This invention relates generally to electromagnetic wave-tuning devices operable over a wide band of ultra-high-frequency ranges, and has specific application to such devices including means and methods for inductively tuning ultra-high-frequency apparatus.

The progression of the television industry has made it necessary to provide for means to accept electromagnetic energy signals encompassing a range of 470–890 megacycles. Since the great number of television receivers now in use are unequipped to receive such ultra-high electromagnetic signals, means operative alone or in conjunction therewith must be provided if the present day equipment is not to become obsolescent.

Thus, to utilize present day television equipment, the present tuner becomes paramount in a converter or adapter used to provide means for accepting signals over the frequency range of 470–890 megacycles and to pass them on at a frequency which may be accepted by the present associated high-frequency television equipment. In using such converters or adapters, it is desirable that the ultra-high-frequency electromagnetic energy be accepted by the tuning device of the converter in such wise and in such a manner that the over-all gain characteristics of the combined receiver-adapter and/or converter be maintained without diminution.

One such tuning device and converter has been described and claimed in co-pending application U. S. Serial No. 246,822.

The present invention provides an improved novel construction of an edge-mounted concentric dual-ribbon ultra-high-frequency tuner that operates so as to continuously accept signals within the ultra-high-frequency range television channels covering 470–890 megacycles, and which is thus adapted for use in any converter used in conjunction with the present day equipment at a minimum of space requirements. The newly constructed converter, as hereinafter described, provides means for maintaining the overall gain characteristics of the associated equipment and, moreover, improves the same so as to give greater efficiency and gain than that normally obtainable from the use of such other equipment.

Still another object of the present invention is to provide compact ultra-high-frequency inductive elements of optimum and efficient electrical characteristics adapted for use in an ultra-high-frequency acceptance device having small dimensions and wherein space requirements are restrictive in nature.

It is, therefore, an object of the present invention to provide a compact, novelly constructed inductive tuning device for operation over a wide band of ultra-high frequencies and having improved gain characteristics.

It is still another object of the present invention to provide a concentric dual-ribbon tuning device, for incorporation into a frequency converter accepting ultra-high-frequency electromagnetic energy signals covering 470–890 megacycles and wherein such tuning devices may be coupled to other components of the converter in a manner such as to improve the over-all gain characteristics thereof.

It is still another object of the present invention to provide an ultra-high-frequency tuning device comprising a plurality of parallel and spaced pairs of concentric inductive ribbons adapted to be positioned in a side-wise manner at one end of an adapter for receiving ultra-high-frequency electromagnetic energy signals and transmitting the same to associated communication equipment.

Yet another object of the present invention is to provide improved circuitry in an electromagnetic frequency converter operative in conjunction with tuning apparatus receiving standard very-high-frequency signals so as to adapt the latter for reception of ultra-high-frequency electromagnetic energy signals in a range of 470–890 megacycles.

Still another object of the present invention is to provide improvements in a dual line tuning device forming the basic tuner of a frequency converter accepting ultra-high-frequency electromagnetic energy signals over the range of 470–890 megacycles, and wherein improvements have been made to said tuning device in a manner such as to increase the gain characteristics thereof.

Another object of the present invention is to provide in an ultra-high-frequency receiver improvements in electrical circuits which make the same operate at greater over-all gain characteristics and efficiency.

The invention, in another of its aspects, relates to novel features of the instrumentalities described herein for teaching the principal object of the present invention and to the novel principles employed in the instrumentalities whether or not these features and principles may be used in the said object and/or in the said field.

Other objects of the invention and the nature thereof will become apparent from the following description considered in connection with the accompanying figures of the drawing and wherein like reference characters describe elements of similar function therein, and wherein the scope of the invention is determined rather from the dependent claims.

Figures 1, 1A:
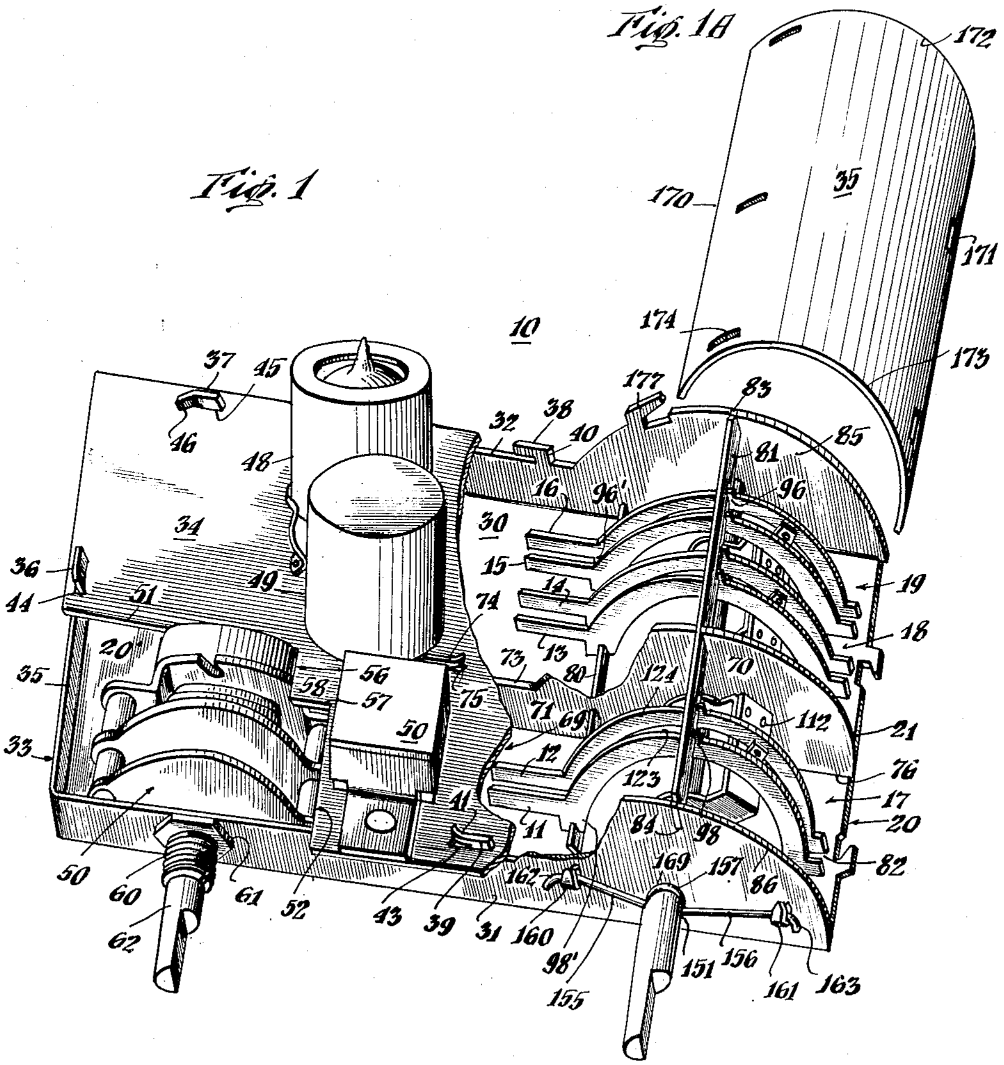
Fig. 1 is a pictorial drawing of the ultra-high-frequency converter which is adapted to receive signals over the frequency ranges 470–890 magacycles so as to adapt the same for use with standard very-high-frequency television receivers.
Fig. 1A is a pictorial drawing of the metal dust-cover used herewith.
Figure 2:
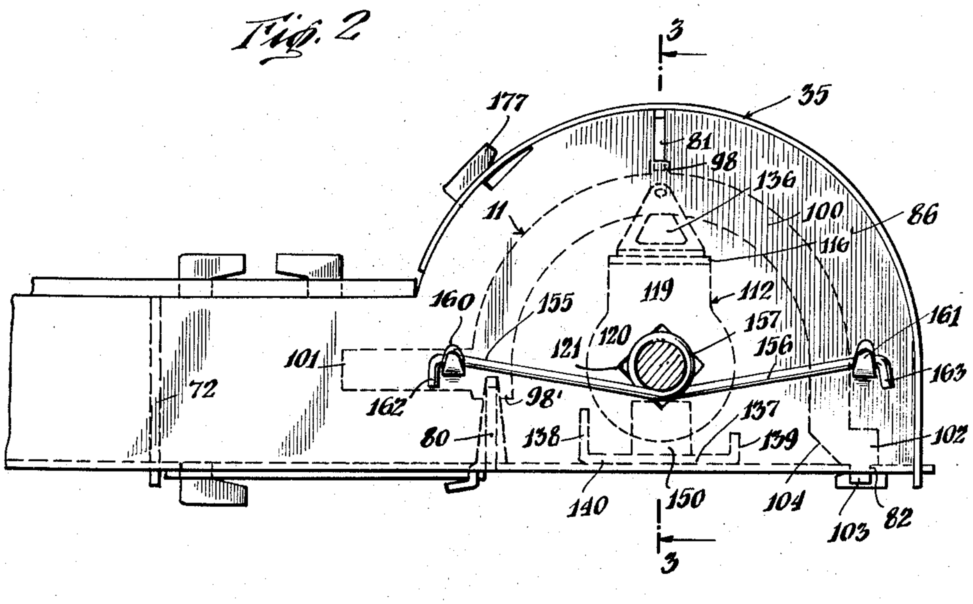
Figure 3:
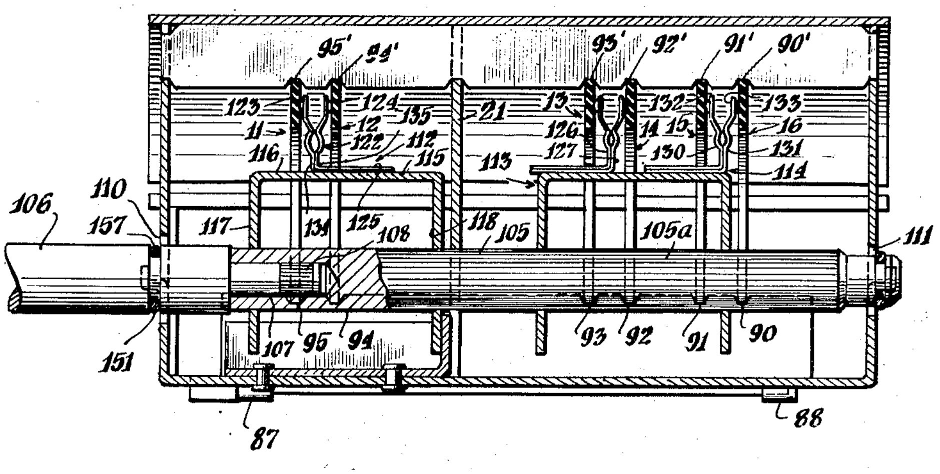

Fig. 2 is a side view of the front portion of the ultra-high-frequency converter of Fig. 1, with portions thereof taken in cross-section and as adapted to illustrate several novel constructional features of the mounting of the individual inductive elements therewithin; and Fig. 3 is a cross-sectional view of the embodiment shown in Fig. 2 and as taken along line 3—3 thereof as adapted to illustrate the coupling and mounting of the individual inductive elements with relation to the motive shaft and the chassis thereof, and as illustrative of the functional relationship between the rotating wipers and the individual inductors.

In the following description, certain specific terms are used for convenience in referring to the various details of the invention. These terms, however, are to be interpreted in accordance with the state of the art and the scope of the invention.

The present invention relates to continuously variable tuning devices of the inductance type. In accordance with the invention, concentrically arranged dual, parallel conductors having a ribbon-like configuration are novelly held and supported each in an upright manner at only a severality of points therein.

The inductive pairs of arched, ribbon conductors are parallel-spaced in a cross-wise manner from one another and fixedly retained about and mounted along the motive shaft of the converter. A contact arm having a V-shaped bifurcated finger arrangement is allowed to ride on the inner surfaces of said arched ribbon conductors in a manner such that the frequency being accepted by means of said inductors is varied in accordance with the amount of rotation of said fingers within said ribbon conductors.

Thus these dual inductor elements, viz. dual-ribbons, concentrically mounted, provide a frequency acceptance range from about 470–890 megacycles within less than one complete rotation of the shaft or a single complete angular excursion of said wipers within said ribbon inductor elements.

Each of the tuning elements, for example the preselector tuning element, may be shaped differently from each other and from its associated tuning element in order to provide optimum ultra-high-frequency tracking. The novel construction herein provided illustrates a tuner requiring a minimum number of turns for negotiating or tracking the entire ultra-high-frequency range of electromagnetic energy available for ultra-high-frequency television receivers and other such equipment.

The variable inductance tuning device or tuner 10 is shown in the drawings, more particularly Fig. 1. The tuning device 10 is a novelly constructed, compact assembly in which pairs of individual inductance elements 11—16 comprise a plurality of tuner sections 17—19 arranged one behind the other in a discretely spaced, seriatim fashion. The improved construction of the tuner elements allows each of the elements to be substantially fixedly mounted and aligned across the front end of the chassis at determined crosswise points by means of a balanced suspension at only points approximately 90° apart. The need for supporting the elements by embedding the entire lengths does not exist here. Thus a considerable saving in construction and material expense is effected among the other novel features relating to the electrical operation of the elements. Further, in the new and novel construction hereof, means are provided to separate the oscillator section from the radio-frequency sections by means of shield plate or partition 21 which acts to divide the chassis end into two separate compartments and so to prevent unwanted electrical interference therebetween. The pairs of individual inductors provide amounts of inductance to the associated circuits in accordance with their electrical lengths as determined by shorting contactor assemblies 22—24 which provide conductive bridges between the individual inductors. The contactor assemblies are adapted to rotate with a shaft assembly 25 concentrically extending through the suspended arch formed by the individual conductors so as to wipe the inside surfaces thereof and thus to vary the electrical length thereof.

Each pair of tuning elements or conductors constitutes an inductive coil. For example, elements 11, 12; 13, 14; and 15, 16, constitute the inductive coils of the tuner respectively. As stated, the tuning elements are shaped in accordance with the inductance and capacitance requirements necessary to fulfill the electrical characteristics of the tunable circuit. Thus in accordance with the aforesaid parameters, oscillator elements 11, 12 may be tapered or shaped differently from preselector or radio frequency elements 15 and 16.

The chassis 30 of the converter comprises front and back ends or sections 20 and 20′, respectively, and includes a base 30 at the longitudinal sides of which there are connected side plates 31 and 32 vertically extending in an upright manner therefrom. Plates 31 and 32 have their front portions fabricated in a manner such as to provide semi-circular configurations, similar to the shape of the arched inductances of the tuner.

At the end of the chassis opposite the semi-circular portion, side plates 31 and 32 are interconnected by a lateral wall or plate 33. It is to be noted that the entire assembly of side plates 31, 32 and interconnecting lateral wall 33 may be stamped or fabricated in one piece, with the separate portion being bent to conform to the shape of base 30. This entire side assembly thus provides an enclosure which, together with upper mounting plate 34 and dust canopy 35, substantially encloses and protects the tuning elements from unwanted dust, vibration, electrical interference and physical damage. At the same time, the novel assembly allows base 34 to be quickly and positively affixed to top lip 35 of side walls 31, 32 and 33 by means of integrally formed ears 36 to 39.

Each of the aforesaid ears 36–39 has neck and head portions 40, 41, respectively, which can be obtruded into conjoining slots such as 43—45. To demountably lock mounting plate 34 to the side wall assembly, a tip portion, for example, 46 of each of the aforesaid ears, is fitted through its associated slot and twisted.

Mounting plate 34 is adapted to seat and stake the tube, crystal, and electrical components such as 48, 49, 50, used in conjunction with the inductive tuning elements situated at the front end of the chassis. It is to be noted that by the novel compact assembly thus provided between the upper and lower base plates and the enclosing side walls, a bin or container is provided wherein may be placed, as desired, associated resistors, capacitors, chokes, etc. involved in the circuits of the tuner. In order to accommodate switch 50 for the tuning device at end 20′, mounting plate 34 has been cut out so that a portion thereof has an extent approximating half that of the cross-wise dimension of the chassis and somewhat less than one-third the lengthwise dimension thereof. Ends 51 and 52 formed thereby are interconnected by means of sides 56 and 57 of a step portion 58. Switch 50, thus snugly accommodated within portion 20′ of the chassis, is mounted on wall 31 by means of a threaded hollow bushing 60 and nut 61 which is adapted to receive a shaft member 62 rotatable therewithin to determine the various positions for activating or inactivating the converter.

A shield or partition 21 adapted to separate the oscillator and radio frequency stages from each other so as to prevent interaction therebetween and to aid in forming the novel arched inductor support means therefor, is also vertically mounted and extends up from base 30 to form a separate compartment 69 defined by semi-circular portion 70, midportion 71, and side end portion 72, bent substantially 90° to portion 71. The shield is mounted and substantially fixed by being joined to mounting plate 34 at its top 73 by means of ear 74 twisted in slot 75, while the lower tip 76 is affixed to bottom plate 30.

The construction of the instant tuner provides individual tuning inductors which are spaced at determined points along the cross-wise dimension of the chassis in an essentially floating or suspended manner without any intervening holding or insulating structure placed therebetween. The type of individual mounting obtained by this construction eliminates the need for supporting, embedding or otherwise retaining the elements in a plastic or molded insulation structure along the entire length thereof. Thus, a great saving of material is accomplished by obviating the necessity for such fabricated materials having critical temperature and insulative qualities. Moreover, many otherwise attendant production and manufacturing steps have been avoided. For example, there is thus no necessity to gouge, knurl or groove the insulative bases which are used to support the conductor ribbons.

The individual inductor elements 11—16 have a semi-circular configuration, as shown particularly in Figs. 1 and 2, and are mounted in an upright manner on and anchored only at three points by means of molded space bars or straps 80 and 81 and cut-outs, such as 82, in base 30. Each individual inductive element extends vertically from the base of the chassis subtending an arc of substantially 180°, and is held at points approximately 90° from each other, with its opposing ends lying along a longitudinal axis substantially the same as the longitudinal diameter of the hemispherical arc. Strap 81 is supported within slots 83 and 84 formed on hemispherical portions 85 and 86 of side walls 31 and 32 of the chassis. Strap 80, as illustrated in Figs. 2 and 3, is mounted and held on the lower plate 30 of the chassis by having struck-out, integrally molded extensions 87 and 88 fitted within associated cut-outs formed in the base so as to substantially fixedly maintain the same thereon. Each of the straps, in accordance with the specifications set up for placing the individual inductors elements in predetermined pairs of parallel planes in a series along the rotatable motive shaft, has pre-formed molded slots such as 90, 90′ to 95, 95′, which cooperate with associate extensions 96, 96′ to 98, 98′ on the inductors to support the same.

Each of the individual inductor elements (Fig. 2), such as 11, is fabricated and stamped out of thin gauge silver-coated brass ribbon and comprises several portions including a center, arch-like portion of semi-circular contour 120, a terminal portion 101 formed at a plane substantially at right angles to the center portion and a dependent portion 98′ joined thereto for affixing the element to its associated spacer bar or strap 80. At the other and opposite end of the arch there is also formed substantially at right angles thereto a dependency or leg 102 having a side 104 cut at an angle of 45° to said center portion. This end of the inductance element is staked to the base by means of a leg portion 103 fitting within an associated slot in the base.

In order to wipe the inside surfaces of the individual pairs of inductances forming the tunable coils, rotatable contactor assemblies 112, 113 and 114 are mounted on a motive shaft. The shaft includes an inside knurled shaft 105 and an outside shaft 106 fittable within a mating bore 107 formed within shaft 105. Shaft 106 is retained within shaft 105 by means of knurled head 108 gripping the inside surface of bore 107. The shaft penetrates each of the inductance elements substantially at the center thereof. The combined inner and outer shaft is supported by bearing surfaces 110, 111 formed in hemispherical portions 85 and 86.

Since the construction of each of the contactor assemblies substantially resembles each other, the description below will apply to all of the assemblies 112, 113 and 114. The assembly, made of thin gauge brass, comprises a contactor bracket 115 having a table configuration fabricated of a flat top portion 116 and legs 117, 118, integrally formed therewith and depending therefrom substantially at 90° thereto. Each of the legs comprises a neck portion 119 integrally connected to a substantially annular head portion 120. An aperture 121 is cut through each of the head portions approximately centrally thereof, through which the motive shaft is adapted to penetrate and to support the bracket of each leg.

Connected to bracket 112 at the top 116 thereof is the contactor arm 122 utilized for making contact with the inside surfaces 123 and 124 of the pair of conductor ribbons of the tuning elements. The contactor arm 122 has been so designed that it has a long life and low contact noise. It comprises dual metallic flange portions 125 connected to top 116 of the contactor assembly in a substantially similar plane.

A pair of sinuously configured fingers 126 and 127 are integrally connected to said flanges and bent substantially at right angles thereto, with the fingers being wider at the base than at the tips thereof, whereby said fingers are seen to be tapered in their width. Said fingers comprise a plurality of sections including a pair of portions 134, 135, bowed midsections 130 and 131, and a pair of brush contacts 132 and 133. Portions 134 and 135 have apertures such as 136 cut therein to aid in the resilience of the contact fingers.

It is to be noted that the entire contact assembly is adapted to be concentrically rotated on the motive shaft within the radial confines of the inductance elements so as to wipe inductance element between the limits of 180° as restricted by U-shaped stop member 137 having limiting stops or extensions 138 and 139 integrally connected to flat member 140.

Motive shaft 106 supported on mounts, such as 150, has its inner shaft 105 splined with a plurality of ridges or splines 105*a* as an aid to predeterminedly maintaining and positioning the wiper assemblies and brackets. To further aid in resiliently but fixedly supporting said combined inner and outer shaft, shaft 106 has a radial groove 151 cut therein whereby a tensioning device such as retaining or shaft support spring 152 fabricated of a length of music wire is looped within groove 151 in a manner such that arms 155 and 156 extending from loop section 157 bear down within ears 160 and 161 integrally formed of semi-circular wall 86 of the chassis so as to be retained therewithin by means of ends 162 and 163 bent substantially 90° to arms 155 and 156. The ears and ends thus provide anchors for said arms since the resilience characteristic of the arms retracts the same against the buttresses provided by the struck out ear portions.

In order to protect the inductive elements from the atmosphere and unwanted dust or moisture, a dust cover or canopy 35 having a bowed configuration is adapted to fit on and overlie semi-circular portions 85, 86 of the tuner chassis. It is noted that in order to accommodate the shaft, portions 85, 86 may have a slot 169 individually cut therein. The dust cover comprises longitudinal and lateral sides 170—173. The dust cover shield 35 may be fabricated of one piece of aluminum and has a series of individual slots, such as 174, cut therein through which separate ears 177 may be fitted and twisted so as to lock the dust cover or shield along the semi-circular circumferences of the chassis.

The description of the present invention of an ultra-high-frequency tuning device for use in receiving electromagnetic wave energy signals in the ultra-high-spectrum, is intended to be illustrative of the applicants' invention and does not intend to restrict the scope thereof.

What is claimed is:

1. A variable inductance tuning device comprising a chassis, said chassis including a pair of spaced longitudinal walls having front semi-circular shaped portions, a plurality of pairs of flat ribbon conductors approximately 180° in length predeterminedly spaced from each other in the same plane as said side longitudinal walls on said chassis, said conductors standing upright thereon and having a spacer bar connected thereto and to the front portions of said chassis so as to determine the spacing of the conductors away from each other along said chassis, terminal means connected to one end of each of said conductors, and contactor means for varying the electrical lengths of each pair of the conductors between said terminal means so as to determine the amount of inductance therein.

2. A variable inductance device comprising a chassis, said chassis including a pair of separated longitudinal walls having front semi-circular portions, a plurality of pairs of flat strip conductors curved to have substantially a radial extent of 180°, said conductors spaced from each other in the same parallel plane along the cross-wise dimension of said chassis, said conductors further being supported upright on said chassis only by means of the opposite ends thereof, rotatable motive means penetrating through each of said conductors substantially within the center thereof, said center being free of any adjacent insulative material, terminal means connected to the ends of said conductors, and means connected to said rotatable motive means for varying the electrical lengths included by the pairs of conductors and said terminal means so as to determine the amount of inductance therein.

3. A variable inductane tuning device comprising a chassis having a pair of side walls, a plurality of thin ribbon conductors approximately 180° in length predeterminedly spaced from each other in a series of paired parallel sections along the cross-wise dimensions of said chassis, means holding said conductors substantially upright on said chassis at opposite ends thereof, said means including spacer bars held between said pair of side walls, one of said bars being spaced 90° away from the other, terminal means connected to one end of each of said conductors, and contactor means for varying the electrical length of the conductors between said terminal means so as to determine the amount of inductance therein.

4. A variable inductance tuning device comprising a chassis having a pair of side walls, a plurality of thin ribbon conductors of approximately 180° in length predeterminedly spaced from each other in a series of paired parallel sections along the cross-wise dimension of said chassis, means holding said conductors substantially upright on said chassis at opposite ends thereof, said means including spacer bars held between said pair of side walls, one of said bars being spaced 90° away from the other, terminal means connected to one end of each of said conductors, and means for varying the electrical length of the conductors between said terminal means so as to determine the amount of inductance therein, said means determining the inductance content of said conductors comprising bifurcated brushes adapted to wipe the inside surfaces of said pairs of conductors.

5. A variable inductance tuning device comprising a chassis, said chassis including spaced, longitudinal walls having its front portions in a semi-circular configuration, a plurality of pairs of flat semi-circular ribbon conductors predeterminedly spaced from each other in a plane similar to that of said side walls and spaced cross-wise in a series along said chassis, said conductors being mounted upright on said chassis by means of its end portions only, one of said end portions of said conductors being supported in a space bar aligned thereby at predetermined points therealong, terminal means connected to the same end of said conductors, and splined shaft means supporting a plurality of bracket assemblies including movable dual finger wipers for wiping the electrical length of the conductors between said terminal means so as to determine the amount of inductance therein.

6. A variable inductance tuning device comprising a plurality of pairs of inductors, each of said inductors comprising a thin conductive ribbon having ends and defining a semi-circular configuration and a cross-section shaped in accordance with predetermined electrical characteristics, said conductors being supported on said chassis in an upright, vertical manner only by said ends with said arch being substantially at the furthest point above said chassis, and movable contactor means for varying the electrical length of the conductors between said ends so as to determine the amount of inductance therein.

7. A variable inductance tuning device comprising a plurality of pairs of inductors, each of said inductors comprising a thin conductive ribbon having ends and defining a semi-circular, arch-like configuration and a cross-section shaped in accordance with predetermined electrical characteristics, said conductors being supported on said chassis in an upright manner only by the ends and middle thereof with the arch being supported at said middle end situated substantially at the furthest radial point above said chassis, and contactor means for varying the electrical length of the conductors between said ends so as to determine the amount of inductance therein.

8. A variable inductance tuning device comprising a chassis having a base and side walls, a plurality of pairs of inductors predeterminedly spaced on said base between said walls, each of said inductors comprising a thin conductive ribbon having ends and defining a semi-circular arch-like configuration having only empty space between its under surface and said base of said chassis, with its cross-section shaped in accordance with predetermined electrical characteristics, said conductors being supported on said chassis in an upright manner by said terminal ends with said arch being placed substantially at the furthest point above said chassis, means for varying the electrical length of the conductors between said terminals so as to determine the amount of inductance therein, said means comprising a splined shaft penetrating through the center of the empty space between the under surface of said conductors and said base, and a plurality of movable contact assemblies maintained at fixed points along said shaft so as to wipe separate pairs of said inductors upon rotation of said shaft.

9. A variable inductance tuning device comprising a chassis having a base and side semi-circular walls, a plurality of pairs of inductors having a radial extent of 180° predeterminedly spaced in a cross-wise series on said base between the confines of said side walls, each of said inductors comprising a thin conductive ribbon having terminal ends placed parallel to said base at 90° to said conductors and having a cross-section shaped in accordance with predetermined inductive characteristics, said ribbons being supported up from said chassis in a vertical manner only by said ends and the middle thereof, the highest point of said arch of said ribbons being placed substantially at its middle point situated the furthest point above said chassis, and rotatable contact brush means for varying the electrical length of the conductors between said terminals so as to determine the amount of inductance therein.

10. A variable inductance tuning device comprising a chassis having a base and side semi-circular walls, a plurality of pairs of inductors having a radial extent of 180° predeterminedly spaced in a cross-wise series on said base between the confines of said side walls, each of said inductors comprising a thin conductive ribbon having terminal ends placed parallel to said base at 90° to said conductors and having a cross-section shaped in accordance with predetermined inductive characteristics, said ribbons being supported up from said chassis in a vertical manner only by said ends and the middle thereof, the highest point of said arch of said ribbons being placed substantially at its middle point situated the furthest point above said chassis, rotatable means for varying the electrical length of the conductors between said terminals so as to determine the amount of inductance therein, said rotatable means including an inner and outer shaft supported by bearing surfaces in said side semi-circular walls, spaced contact assemblies supported on said shaft at predetermined points therealong, with the spatial alignment of said conductors being fixed by means of associated space bars retained between said side walls.

11. A variable inductance tuning device comprising a chassis having a lower base and a pair of spaced side walls, a plurality of pairs of inductors placed at determined points along said base, each of said inductors comprising a thin conductive ribbon having angulated terminal ends and defining a semi-circular configuration and a cross-section shaped in accordance with predetermined electrical characteristics, space bars spaced 90° apart aligning said inductors along said base, said inductors being supported on said chassis in an upright, vertical manner by said ends and space bars, with the arch formed in said semi-circular shape being placed substantially at the furthest point above said chassis and having empty space therebeneath, moving contact driving means for varying the electrical length of the conductors between said terminals so as to determine the amount of inductance therein passing through the empty space beneath said arch, support means for supporting said driving means, and resilient means wound about said driving means to resiliently anchor the same as it is rotatably driven.

12. A variable inductance tuning device comprising a chassis having a lower base and a pair of spaced side walls, a plurality of pairs of inductors placed at determined points along said base, each of said inductors comprising a thin conductive ribbon having angulated terminal ends and defining a semi-circular configuration and a cross-section shaped in accordance with predetermined electrical characteristics, space bars spaced 90° apart aligning said inductors along said base, said inductors being supported on said chassis in an upright vertical manner by said ends and space bars, with the arch formed in said semi-circular shape being placed substantially at the furthest point above said chassis and having empty space therebeneath, moving contact driving means for varying the electrical length of the conductors between said terminals so as to determine the amount of inductance therein passing through the empty space beneath said arch, support means for supporting said driving means, resilient means wound about said driving means to resiliently anchor the same as it is rotatably driven, and stop means for limiting the angular excursion of said contact driving means while varying the electrical length of said conductors.

13. A variable inductance tuning device comprising a chassis having side walls and a lower base, a plurality of pairs of inductors defining preselector and oscillator tuning sections, each of said inductors comprising a thin conductive ribbon having terminal ends and defining a semi-circular configuration and a cross-section shaped in accordance with predetermined electrical characteristics spaced between said side walls along said base, said conductors being supported on said chassis in an upright manner by said ends to form an arch placed substantially at the furthest point above said chassis, a shield plate having a semi-circular portion separating said preselector sections from said oscillator sections, and contactor means for varying the electrical length of the conductors between said terminals so as to determine the amount of inductance therein.

14. A variable inductance tuning device comprising a chassis having side walls and a lower base, a plurality of pairs of inductors defining preselector and oscillator tuning sections, each of said inductors comprising a thin conductive ribbon having terminal ends and defining a semi-circular configuration and a cross-section shaped in accordance with predetermined electrical characteristics spaced between said side walls along said base, said conductors being supported on said chassis in an upright manner by said ends to form an arch placed substantially at the furthest point above said chassis, a shield plate having a semi-circular portion separating said preselector sections from said oscillator sections, moving contact means for varying the electrical length of the conductors between said terminals so as to determine the amount of inductance therein, and a dust cover substantially snugly fittable over said arched inductors, said shield, and said side walls.

References Cited in the file of this patent

UNITED STATES PATENTS

| | | |
|---|---|---|
| 1,857,155 | Kellogg | May 10, 1932 |
| 2,046,994 | Antonietta | July 7, 1936 |
| 2,113,758 | De Vries | Apr. 12, 1938 |
| 2,126,541 | De Forest | Aug. 9, 1938 |
| 2,292,254 | Van Beuren | Aug. 4, 1942 |
| 2,341,345 | Van Billiard | Feb. 8, 1944 |
| 2,463,417 | Overacker | Mar. 1, 1949 |
| 2,543,560 | Thias | Feb. 27, 1951 |
| 2,558,482 | Galitz | June 26, 1951 |
| 2,584,176 | Wingert | Feb. 5, 1952 |
| 2,629,081 | Hubbard | Feb. 17, 1953 |